(12) United States Patent
Fangonilo et al.

(10) Patent No.: US 6,208,516 B1
(45) Date of Patent: Mar. 27, 2001

(54) ELECTROMAGNETIC INTERFERENCE SHIELD AND GAP FILLER FOR A CIRCUIT BOARD

(75) Inventors: Francisco Fangonilo, Milpitas; Suinin William Wong, Fremont, both of CA (US)

(73) Assignee: Apple Computer, Inc., Cupertino, CA (US)

( * ) Notice: Subject to any disclaimer, the term of this patent is extended or adjusted under 35 U.S.C. 154(b) by 0 days.

(21) Appl. No.: 09/309,322

(22) Filed: May 11, 1999

(51) Int. Cl.$^7$ ............................... H05K 7/20; H05K 9/00
(52) U.S. Cl. ..................... 361/704; 165/80.2; 165/185; 174/16.3; 174/35 R; 174/713; 256/659; 361/818
(58) Field of Search .................. 165/80.2, 80.3, 165/185; 174/16.3, 35 R, 35 MS, 35 GC, 35 CE; 257/659, 660, 728, 707, 713; 361/704, 707–710, 714, 717–718, 816, 818, 820

(56) References Cited

U.S. PATENT DOCUMENTS

| | | | |
|---|---|---|---|
| 4,759,466 | 7/1988 | Chase et al. ......................... 220/306 |
| 5,541,811 | * 7/1996 | Henningsson et al. .............. 361/704 |
| 5,566,052 | * 10/1996 | Hughes ................................ 361/704 |
| 5,680,297 | 10/1997 | Price et al. ........................... 361/818 |
| 5,740,013 | * 4/1998 | Roesner et al. ...................... 361/704 |
| 5,774,337 | 6/1998 | Lee et al. ............................. 361/725 |
| 5,864,088 | 1/1999 | Sato et al. ........................ 174/35 MS |
| 5,866,943 | * 2/1999 | Mertol ................................ 257/659 |
| 5,880,930 | 3/1999 | Wheaton .............................. 361/690 |

OTHER PUBLICATIONS

"EMI Suppressor Sheets", Tokin, 2$^{nd}$ ed., Oct. 30, 1997, 2 pages.

* cited by examiner

Primary Examiner—Gregory Thompson
(74) Attorney, Agent, or Firm—Burns, Doane, Swecker & Mathis, L.L.P.

(57) ABSTRACT

A suppression layer made from material that reduces EMI is placed between an circuit board and a heat sink. At least one opening in the suppression layer allows the top surface of at least one electronic component to be thermally coupled to the heat sink. In addition to reducing EMI, the suppression layer fills in the space created between the various components on the circuit board. Filling in the gaps prevents the heat sink from rocking and moving, thereby protecting the at least one component coupled to the heat sink from damage. Filling in the gaps with the suppression layer also allows the heat sink to achieve and maintain secure thermal contact with the at least one electronic component on the circuit board.

6 Claims, 4 Drawing Sheets

ELECTROMAGNETIC INTERFERENCE SHIELD AND GAP FILLER FOR A CIRCUIT BOARD

BACKGROUND OF THE INVENTION

1. Field of the Invention

The present invention relates to circuit boards having electronic components coupled thereto, and more particularly to electromagnetic interference shielding. Still more particularly, the present invention relates to an electromagnetic interference shield and gap filler for a circuit board.

2. Description of the Prior Art

One of the issues facing manufacturers of electronic devices, such as computers, is electromagnetic interference (EMI). EMI interferes with other electronic circuits and devices. One source of EMI is a circuit board having electronic components coupled thereto. For example, a circuit board having a microprocessor and other electronic components emits EMI.

EMI emissions can be aggravated by a heat sink coupled to some or all of the electronic components on the circuit board. As known in the art, a heat sink conducts heat away from electronic components that require cooling during operation. But a heat sink can also act as an antenna, which intensifies the EMI emissions from the board.

Another problem with a heat sink is that it can damage some of the electronic components. Typically electronic components on a circuit board are coupled to the board such that the top surfaces of the components are at differing elevations from the surface of the circuit board. Consequently, uneven gaps are formed between components and an overlying heat sink. When the heat sink is then thermally coupled to at least some of the components on the board, the heat sink can rock as a result of the gaps. This rocking can damage the corners and edges of the components.

U.S. Pat. No. 5,880,930 by Wheaton discloses an enclosure that functions as both a heat sink and an EMI shield. The enclosure consists of a top housing and a bottom housing made from thermally conductive material such as aluminum. A circuit board having a microprocessor and other electronic components attached to it is housed within the top and bottom housings. The top and bottom housings are held together by four screws. The four screws also connect the enclosure to the logic board. The enclosure reduces EMI emissions while acting as a heat sink as well.

The problem with an enclosure-type EMI shield and heat sink is that it can be expensive to manufacture and makes manufacturing the logic board more complex. Additionally, it makes replacing the microprocessor or other electronic components on the board more difficult, since the EMI shield must be disassembled in order to access the electronic components.

Another technique used to reduce EMI from a circuit board is to add extra ground layers in the board. This allows the components that emit EMI to be better grounded, thereby reducing the EMI emissions from the board. But adding ground layers to a circuit board greatly increases the cost of the circuit board. It also makes manufacturing the circuit board more complex. Moreover, adding additional ground layers in a circuit board may not substantially reduce the EMI emissions. This is because it can be difficult to get a ground layer to the location it is needed most in order to reduce EMI.

SUMMARY OF THE INVENTION

The present invention overcomes the limitations of the prior art by providing a simple and effective method for reducing EMI from a circuit board with electronic components, such as a microprocessor. A suppression layer made from material that reduces EMI is placed between a circuit board and a heat sink. At least one opening in the suppression layer allows the top surface of at least one electronic component to be thermally coupled to the heat sink. In addition to reducing EMI, the suppression layer fills in the space created between the various components on the circuit board and the heat sink. Filling in the gaps prevents the heat sink from rocking and moving while coupled to the circuit board, thereby protecting the at least one component coupled to the heat sink from damage. Filling in the gaps with the suppression layer also allows the heat sink to achieve and maintain secure thermal contact with the at least one electronic component on the circuit board.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

To facilitate an understanding of the present invention, it is described hereinafter in the context of a specific embodiment. In particular, reference is made to the implementation of the invention in a general purpose computer system. It will be appreciated, however, that the practical applications of the invention are not limited to this particular embodiment. Rather, the invention can be employed in other types of electronic devices that require the reduction of EMI, examples being computer peripherals such as laser printers and consumer electronics such as compact disk players.

Figure 1:
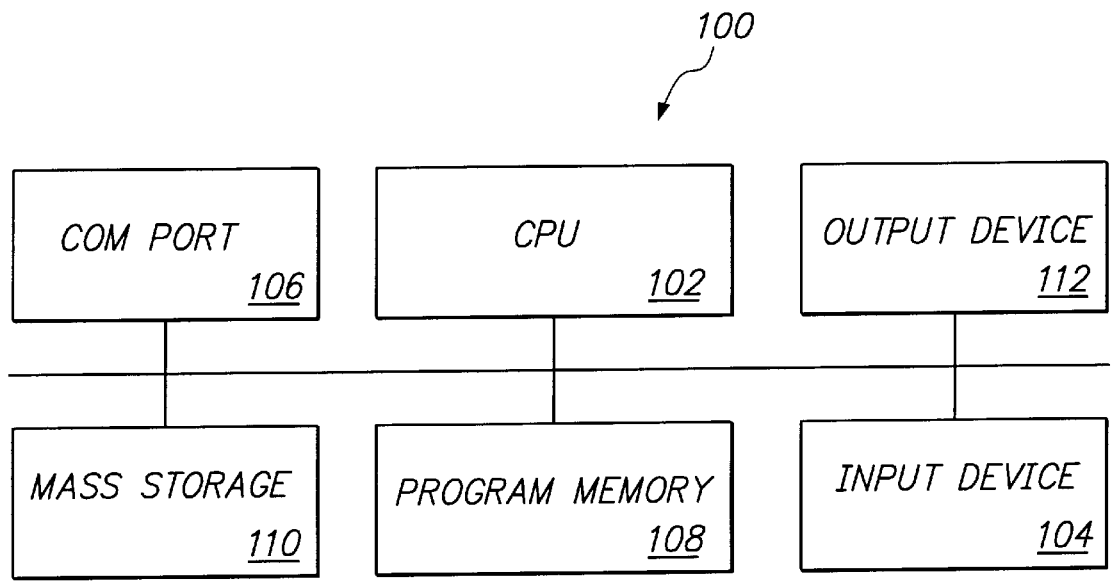
FIG. 1 is an exemplary block diagram of a general purpose computer system that can be used to implement the present invention.

With reference now to the figures and in particular with reference to FIG. 1, a general purpose computer system that can be used to implement the present invention is illustrated. Computer system 100 includes a central processing unit (CPU) 102 that typically is comprised of a microprocessor, related logic circuitry, and related memory circuitry. Input device 104 provides input to CPU 102, with examples of input devices including a keyboard, mouse, or stylus. Communications port (Com. Port) 106 is used for interfacing with other processors and communication devices, such as modems and area networks. Program memory 108 contains operating instructions for directing the control of CPU 102. Mass storage 110 contains stored data that is utilized by CPU 102 in executing the program instructions from program memory 108. And finally, output device 112 outputs data and information to a user. Examples of output devices include a monitor or printer.

Figure 2:
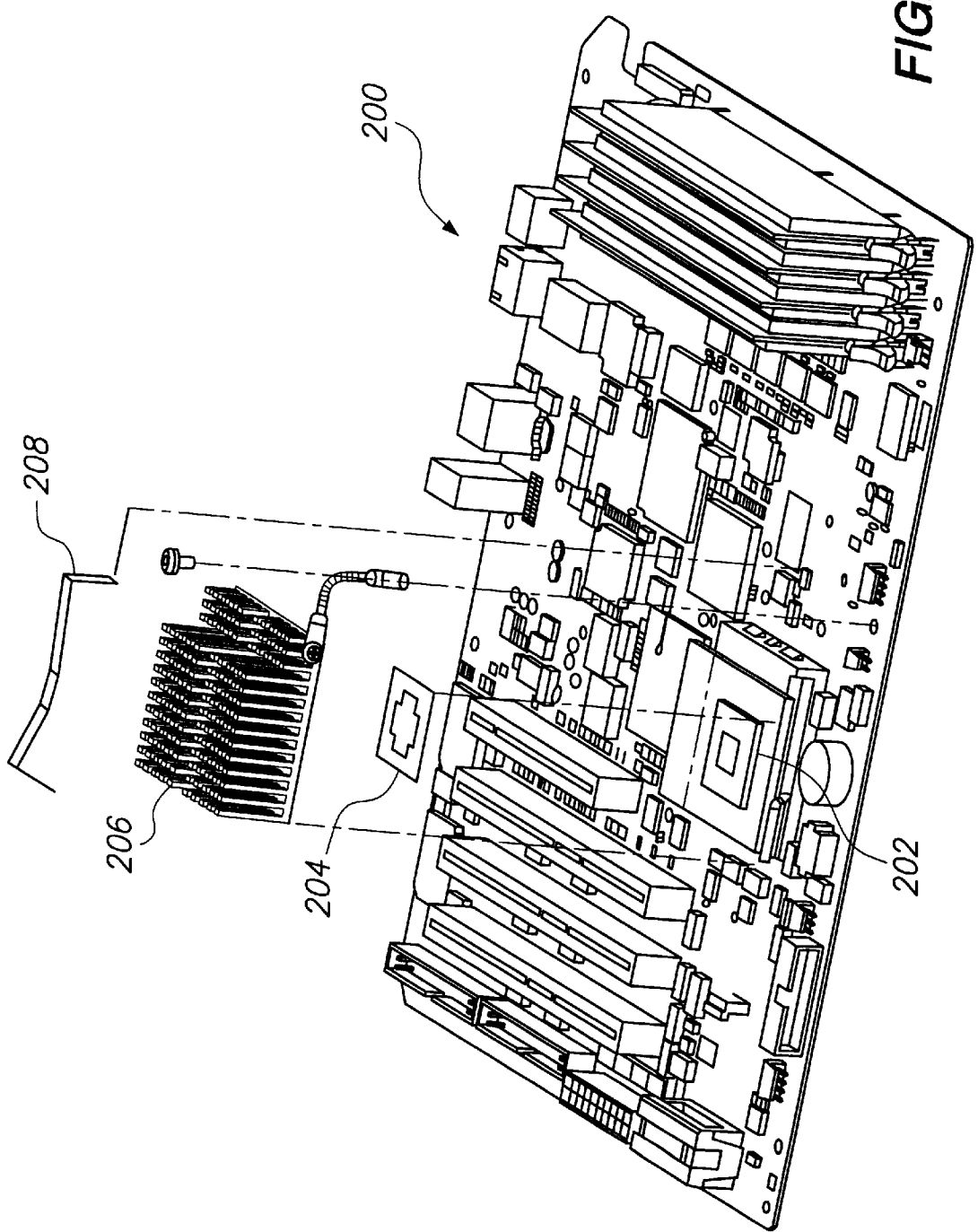
FIG. 2 is an exemplary diagram of a circuit board depicting an exploded view of the relevant portions of the circuit board according to the present invention.

FIG. 2 is an exemplary diagram of a circuit board depicting an exploded view of the relevant portions of the circuit board according to the present invention. Circuit board 200 includes microprocessor printed circuit board 202, suppression layer 204, heat sink 206, and spring 208. Microprocessor printed circuit board 202 is coupled with circuit board 200 using conventional techniques known in the art. For example, microprocessor printed circuit board 202 can be soldered onto circuit board 200, or it can be fitted into an interconnect socket. The interconnect socket allows microprocessor printed circuit board 202 to be easily removed and replaced.

Suppression layer 204 is placed between microprocessor printed circuit board 202 and heat sink 206. Suppression layer 204 is preferably made from material that can suppress electromagnetic interference (EMI) waves. One type of material that can be used as suppression layer 204 is soft magnetic material. This type of EMI suppressor material is sold by Tokin Corporation, located in Tokyo, Japan. Suppression layer 204 will be discussed in more detail with reference to FIG. 3.

Heat sink 206 is affixed to circuit board 200 by spring 208. Spring 208 ensures heat sink 206 is firmly affixed to circuit board 200 when properly in place, but also allows for removal of heat sink 206 when access to microprocessor printed circuit board 202 is required. As known in the art, heat sink 206 conducts heat away from the electronic components of microprocessor printed circuit board 202.

Figure 3:
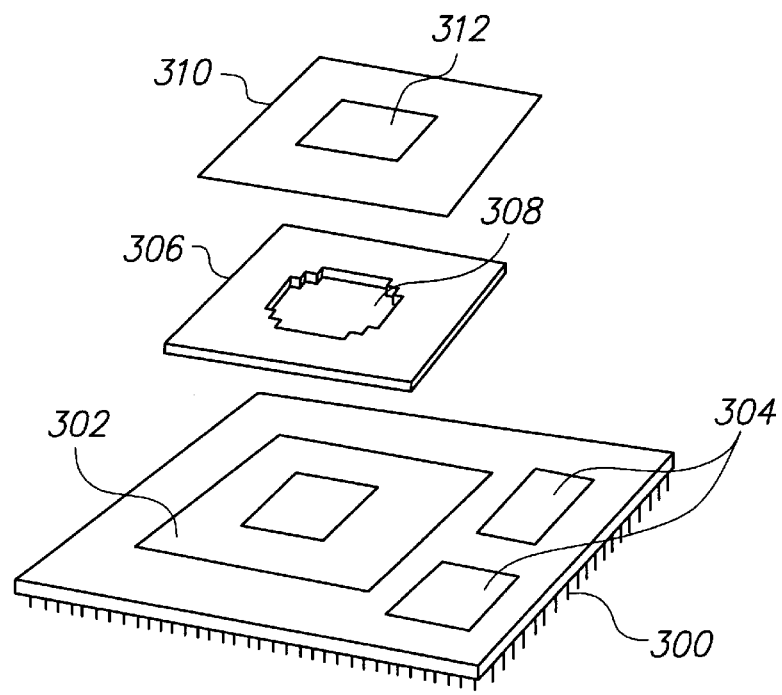
FIG. 3 is an exemplary illustration of a microprocessor printed circuit board utilizing the present invention.

Referring to FIG. 3, an exemplary microprocessor printed circuit board utilizing the present invention is illustrated. Microprocessor printed circuit board 300 has a microprocessor 302 coupled thereto. Electronic components 304 are also shown coupled to printed circuit board 300. Electronic components 304 can be comprised of several types of devices, one example being cache memory.

Suppression layer 306 with opening 308 preferably overlies a portion of printed circuit board 300. Opening 308 allows the top surface of microprocessor 302 to be thermally coupled to a heat sink (not shown) so that the heat generated by microprocessor can be dissipated. Suppression layer 306 also fills in the gaps formed by the different elevations of the top surfaces of microprocessor 302 and electronic component 304 relative to the heat sink. Filling in the gaps prevents the heat sink from rocking and moving while coupled to circuit board 300. This in turn prevents the edges and corners of microprocessor 302 and electronic components 304 from being damaged. Filling in the gaps with suppression layer 306 also allows the heat sink to achieve and maintain secure thermal contact with microprocessor 302 and electronic components 304.

But in the preferred embodiment suppression layer 306 does not cover electronic components 304 on circuit board 300. This allows the heat sink (not shown) to be thermally coupled to the top surface of electronic components 304 as well. An alternative to the preferred embodiment is to have suppression layer 306 cover all of printed circuit board 300. In this situation, suppression layer 306 would have additional openings (shown as opening 314 in FIG. 5c) so that the top surfaces of microprocessor 302 and electronic components 304 can be thermally coupled to a heat sink.

An insulation layer 310 having an opening 312 overlies suppression layer 306. Opening 312 allows the top surface of microprocessor 302 to be thermally coupled to a heat sink (not shown). Insulation layer 310 prevents microprocessor 302 and/or electronic components 304 from shorting when the heat sink is coupled to the circuit board.

Figure 4:
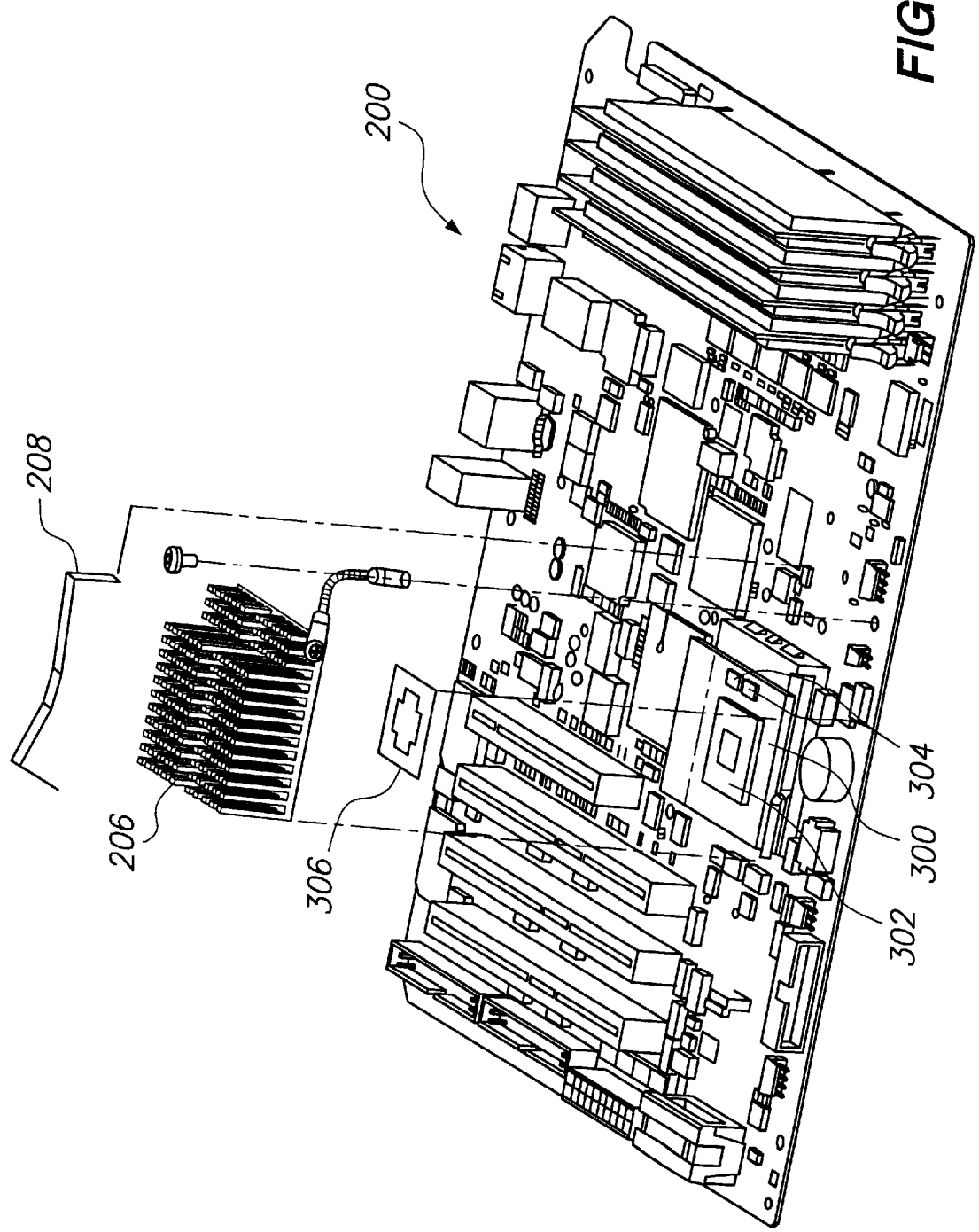
FIG. 4 is an exemplary diagram of a circuit board depicting an exploded view of the relevant portions of the circuit board, including those elements shown in FIG. 3, according to the present invention.

FIG. 4 is an exemplary diagram of a circuit board depicting an exploded view of the relevant portions of the circuit board according to the present invention and with reference to the elements shown in FIG. 3. In particular, electronic components 304 are shown to be coupled to printed circuit board 300, which also has microprocessor 302 coupled thereto.

Figure 5A:
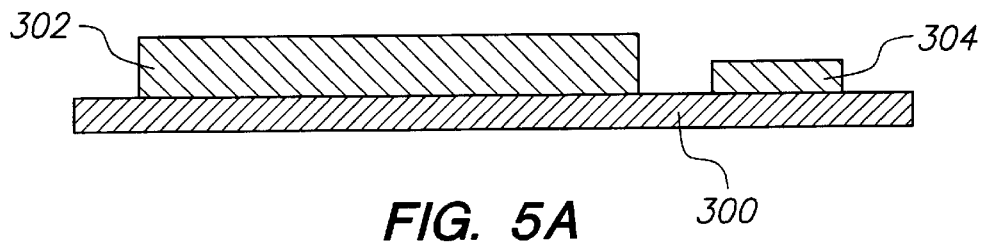
FIGS. 5a-5c illustrate side views of a microprocessor printed circuit board, with FIG. 5c being an exemplary illustration of the present invention.
Figure 5B:
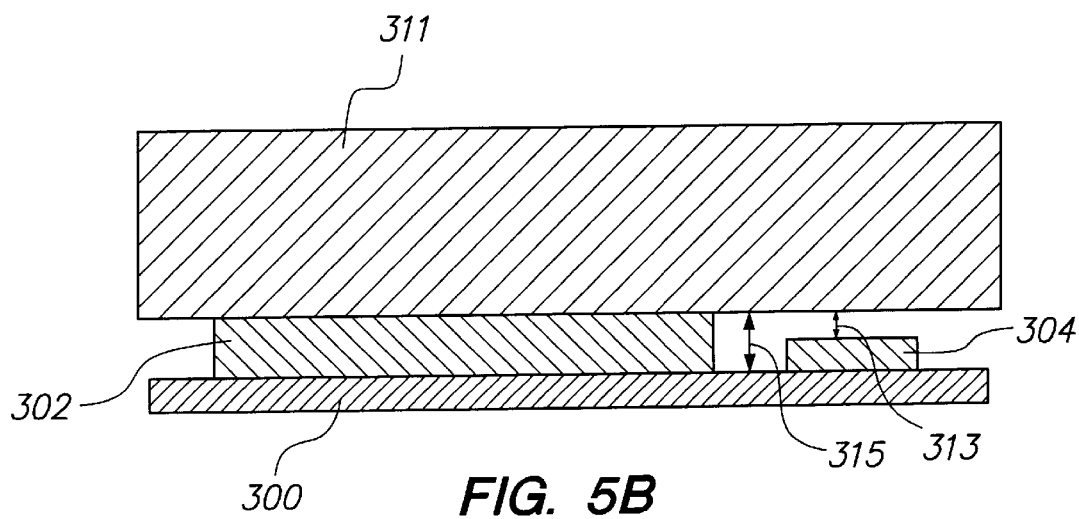
Figure 5C:
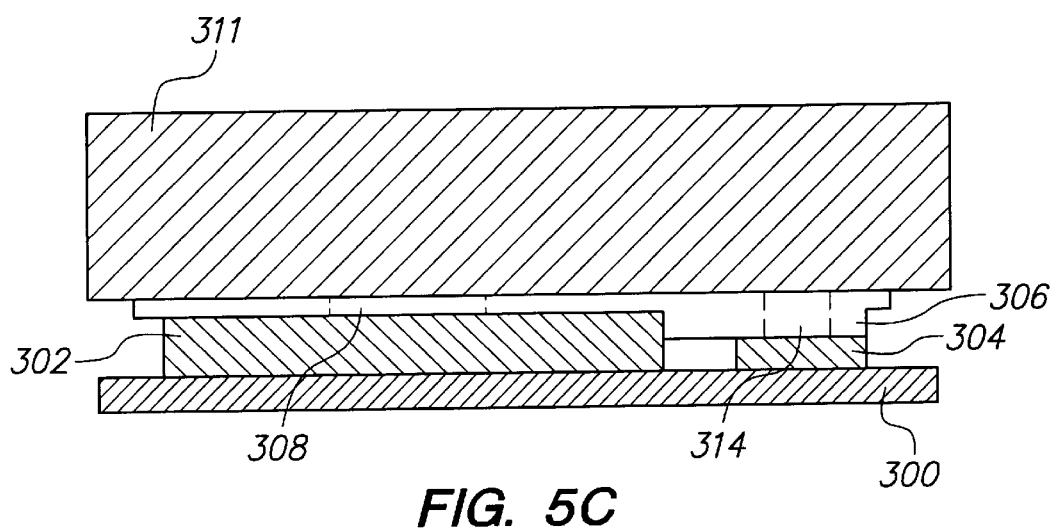

FIGS. 5a-5c show side views of a printed circuit board and various component configurations to illustrate some features of an embodiment of the present invention, with reference to FIG. 3. FIG. 5a shows microprocessor 302 and electronic component 304 (shown as a single component in the side view) coupled to the printed circuit board 300. In this example, as shown in the figure, the top surface of microprocessor 302 is at a higher elevation than the top surface of electronic component 304.

In FIG. 5b, a heat sink 311 is shown to be coupled to the top surface of microprocessor 302, thereby creating gaps 313 and 315 between the heat sink and the top surface of electronic component 304 and the top surface of printed circuit board 300, respectively. As described before, such a configuration as the example shown in FIG. 5b may result in the movement of heat sink 311, which may cause damage to the edges and corners of microprocessor 302 and electronic component 304.

FIG. 5c is an exemplary illustration of the components of FIGS. 5a and 5b utilizing the present invention. Suppression layer 306 is shown to overlie the printed circuit board 300, and has an opening 308 and an optional opening 314 to allow thermally coupling between heat sink 311 and microprocessor 302 and electronic component 304, respectively. Suppression layer 306 is preferably made from material that can suppress EMI waves. As shown in the figure, a portion of suppression layer 306 fills in gap 313 between heat sink 311 and electronic component 304, which prevents the rocking and moving of heat sink 311 while coupled to microprocessor 302. Alternatively, suppression layer 306 may fill in both gaps 313 and 315, or gap 315 alone.

Those skilled in the art will appreciate that the present invention provides many advantages over prior art methods of reducing EMI emissions from a circuit board. For example, it is easy and inexpensive to use. Second, it eliminates the need for any circuit modifications to the board, such as adding additional ground layers. The present invention also helps to prevent damage to the electronic components on the board caused by the heat sink moving while it is coupled to the board. And lastly, it allows the heat sink to achieve and maintain secure thermal contact with those electronic components that require cooling.

What is claimed is:

1. A system for reducing electromagnetic interference comprising:
    a circuit board having a plurality of electronic components coupled thereto, wherein each of the plurality of electronic components has a top surface;
    a suppression layer having at least one opening therein and overlying at least a portion of the circuit board, wherein the suppression layer is substantially planar and comprised of material that reduces electromagnetic interference; and
    a heat sink overlying the suppression layer and at least a portion of the circuit board, wherein the at least one opening in the suppression layer allows the top surface of at least one of the plurality of electronic components to be thermally coupled to the heat sink, and wherein the suppression layer fills in gaps caused by the top surfaces of the plurality electronic components having differing elevations from the circuit board.

2. The system of claim 1, wherein the at least one of the plurality of the electronic components is an integrated circuit.

3. The system of claim 2, wherein the integrated circuit comprises a microprocessor.

4. The system of claim 1, wherein the suppression layer is comprised of soft magnetic material.

5. A system for reducing electromagnetic interference comprising:

a circuit board having a microprocessor coupled thereto, the microprocessor having a top surface;

a suppression layer having an opening therein overlying the microprocessor, wherein the suppression layer is substantially planar and comprised of material that reduces electromagnetic interference; and a heat sink overlying the suppression layer and at least a portion of the circuit board, wherein the opening in the suppression layer allows the top surface of the microprocessor to be thermally coupled to the heat sink, and wherein the suppression layer fills in gaps around the microprocessor caused by the top surface of the microprocessor having an elevation from the circuit board.

6. The system of claim 5, wherein the suppression layer is comprised of soft magnetic material.

* * * * *